(12) United States Patent
Hwang et al.

(10) Patent No.: US 6,714,042 B1
(45) Date of Patent: *Mar. 30, 2004

(54) SPECIALIZED PROGRAMMABLE LOGIC REGION WITH LOW-POWER MODE

(75) Inventors: Chiao Kai Hwang, Fremont, CA (US); Gregory Starr, San Jose, CA (US); Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/384,905

(22) Filed: Mar. 6, 2003

Related U.S. Application Data (63) Continuation of application No. 09/955,654, filed on Sep. 18, 2001, now Pat. No. 6,566,906.

(51) Int. Cl.[7] .......................... G06F 7/50; H03K 19/173
(52) U.S. Cl. ............................. 326/38; 326/47; 326/58; 708/710
(58) Field of Search ................. 326/37, 38, 39, 326/41, 47, 58; 708/710

(56) References Cited

U.S. PATENT DOCUMENTS

| | | | |
|---|---|---|---|
| 3,473,160 A | 10/1969 | Wahlstrom | 340/172.5 |
| 5,122,685 A | 6/1992 | Chan et al. | 307/465.1 |
| RE34,363 E | 8/1993 | Freeman | 307/465 |
| 5,349,250 A | 9/1994 | New | 307/465 |
| 5,483,178 A | 1/1996 | Costello et al. | 326/41 |
| 5,689,195 A | 11/1997 | Cliff et al. | 326/41 |
| 5,751,164 A | 5/1998 | Sharpe-Geisler et al. | 326/38 |
| 6,169,419 B1 | 1/2001 | De et al. | 326/58 |
| 6,172,518 B1 | 1/2001 | Jenkins, IV. et al. | 326/37 |
| 6,215,326 B1 | 4/2001 | Jefferson et al. | 326/41 |
| 6,218,858 B1 * | 4/2001 | Menon et al. | 326/39 |
| 6,259,275 B1 | 7/2001 | Beiu | 326/112 |
| 6,407,576 B1 | 6/2002 | Ngai et al. | 326/41 |
| 2002/0089348 A1 | 7/2002 | Langhammer | 326/38 |

FOREIGN PATENT DOCUMENTS

| | | |
|---|---|---|
| EP | 0 167 047 | 1/1986 |
| WO | WO95/16993 | 6/1995 |

* cited by examiner

*Primary Examiner*—Daniel Chang
(74) *Attorney, Agent, or Firm*—Fish & Neave; Jeffrey H. Ingerman (57) ABSTRACT

In a specialized functional region of a programmable logic device, in which certain components may not be used, those components can be placed in a low-power mode so that they do not switch. For example, in an adder which is not being used but is receiving inputs, the current path for the adding circuitry is interrupted, while the output is forced low. If the adder is a carry/look-ahead adder, the GENERATE and PROPAGATE signals normally used in subsequent stages to predict the value of the carry signal are forced to constant values even if the inputs to the adder are changing.

40 Claims, 6 Drawing Sheets

SPECIALIZED PROGRAMMABLE LOGIC REGION WITH LOW-POWER MODE

This is a continuation of, commonly-assigned U.S. patent application No. 09/955,654, filed Sep. 18, 2001, now U.S. Pat. No. 6,566,906.

BACKGROUND OF THE INVENTION

This invention relates to a specialized logic region in a programmable logic device for use in applications in which the specialized region may optionally not be used. More particularly, this invention relates to such a specialized region having a low-power mode for applications in which it is not being used. Most particularly, this invention relates to an multiplier/accumulator region having such a low-power mode.

It is known in programmable logic devices to provide many logic regions, some of which may not be used in a particular user configuration. If a logic region is not used, but signals nevertheless are routed to that region, the capacitances of the various transistors and other components within that region will continually be charged and discharged, consuming power unnecessarily. However, typically, signals simply are not routed to the regions that are not being used.

More recently, there has been interest in providing, on a programmable logic device, regions particularly well suited to particular functions. The user, in programming the device, could elect to use those regions if those particular functions were required. Preferably, those regions would be flexible, so that even within the regions there would be elements that the user program could select to use or not use. In such a case, signals would be routed to the region, and may reach elements within the region that are not used, consuming power unnecessarily as described above.

In view of the foregoing it would be desirable to be able to provide a programmable logic device having specialized regions within which components that are not used consume less power.

SUMMARY OF THE INVENTION

It is an object of the present invention to provide a programmable logic device having specialized regions within which components that are not used consume less power. This and other objects of the invention are accomplished in accordance with the principles of one aspect of the invention by providing, part of a programmable logic device, a specialized functional region that includes a specialized functional circuit that can effectively be turned off if it is not being used.

In particular, there is provided, in accordance with the present invention, a specialized functional region for a programmable logic device. The specialized functional region includes functional circuitry that performs at least one specialized function. The functional circuitry includes at least one functional circuit input and at least one functional circuit element that consumes power when the functional circuit input changes state. At least one control element, having a control input, is responsive to a low-power mode selection signal on the control input for at least reducing consumption of power by the functional circuit element.

BRIEF DESCRIPTION OF THE DRAWINGS

The above and other objects and advantages of the invention will be more apparent upon consideration of the following detailed description, taken in conjunction with the accompanying drawings, in which like reference characters refer to like parts throughout, and in which.

DETAILED DESCRIPTION OF THE INVENTION

As described above, if a programmable logic device includes a specialized functional circuit that in turn includes elements that may or may not be used, then if those elements are not used, even though the specialized functional circuit is used, changing signals within the specialized functional circuit may cause components of the unused elements to charge and discharge, consuming power. Moreover, those components may generate signals that cause other circuit elements in the specialized functional circuit to change state and consume power.

The present invention overcomes the aforementioned disadvantage by turning off components of unused circuit elements, or by forcing the output of an unused circuit element into a particular state, so that it does not cause switching of components of other unused circuit elements, which might cause unnecessary switching, and therefore unnecessary power consumption, in the programmable logic device. In the case of turning off a component, that might be accomplished as simply as by interrupting the component's power supply. Similarly, in the case of forcing an output into a particular state, that might be accomplished by replacing a gate with a slightly modified gate that can accept an extra input to force a particular output.

The invention is best described by reference to FIGS. 1–5.

Figure 1:
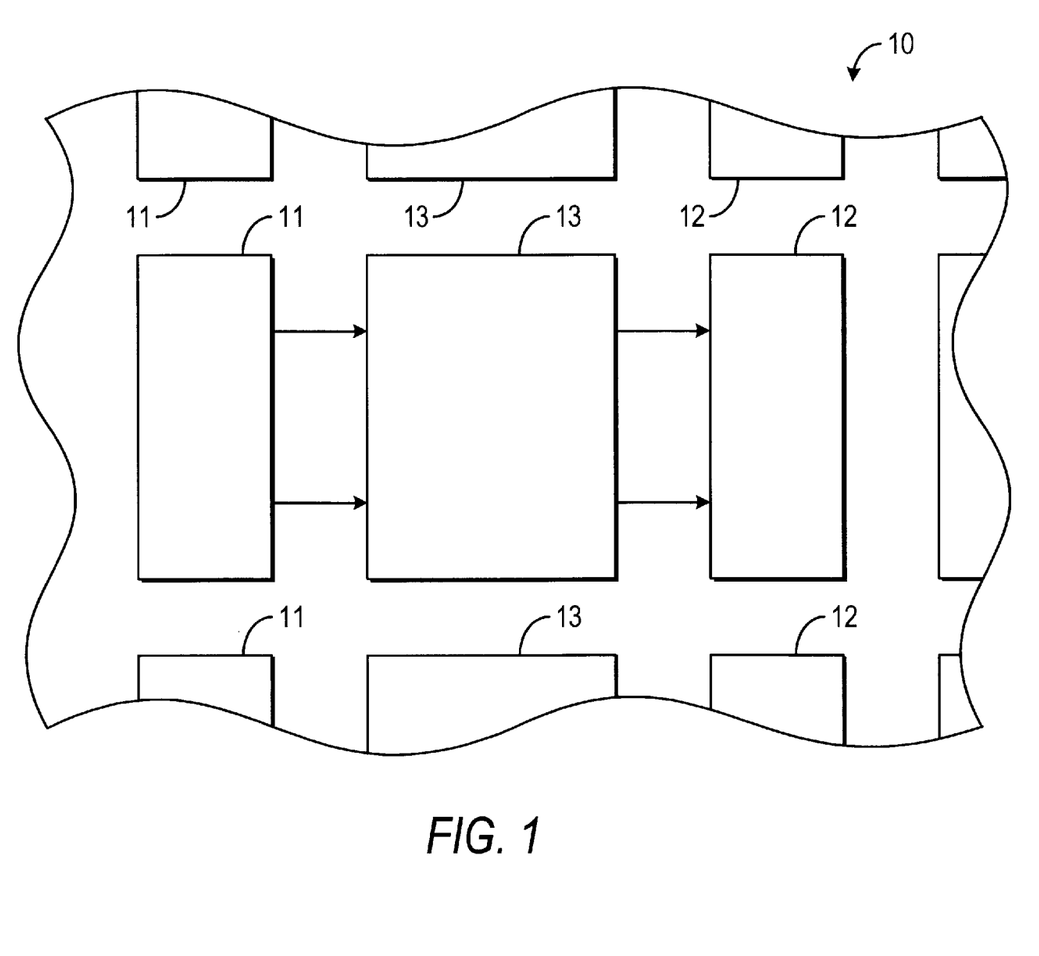
FIG. 1 is a fragmentary schematic diagram of a programmable logic device incorporating the present invention.
Figure 2:
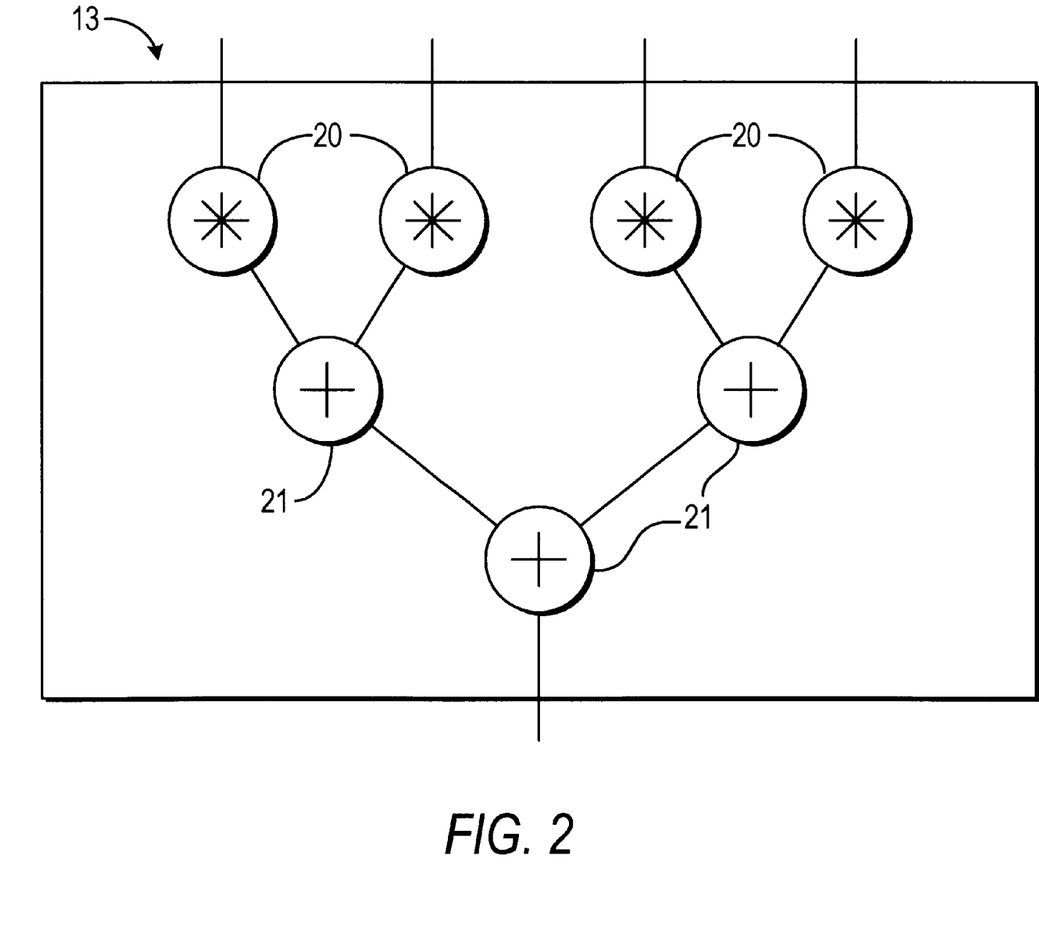
FIG. 2 is a simplified schematic diagram of a multiplier/accumulator block incorporating the present invention.

FIG. 1 shows a portion of a programmable logic device 10 incorporating the claimed invention. Programmable logic device 10 preferably includes a plurality of regions 11, 12 of programmable logic, and a specialized functional region 13. Preferably, outputs of programmable logic region 11 are inputs to specialized functional region 13, while outputs of specialized functional region 13 are inputs to programmable logic region 12. However, other configurations are possible in which specialized functional region 13 either accepts inputs directly from input pins (not shown) of programmable logic device 10 or generates outputs that connect directly to output pins (not shown) of programmable logic device 10.

as shown in FIG. 2, in a preferred embodiment, specialized functional region 13 is a multiplier/accumulator region preferred capable of preforming addition, subtraction, multiplication, and accumulation of the results of the operations. Such a specialized function region may be referred to as a multiplier-accumulator ("MAC")block because the results of several multiplications 20 may be accumulated by adders 21, or as a "DSP" block because it is useful for digital signal processing. The provision of such blocks is described in more detail in commonly-assigned application Ser. No. 09/955,645, filed Sep. 18, 2001, now U.S. Pat. No. 6,538,470, which is hereby incorporated by reference herein in its entirety.

Figure 3:
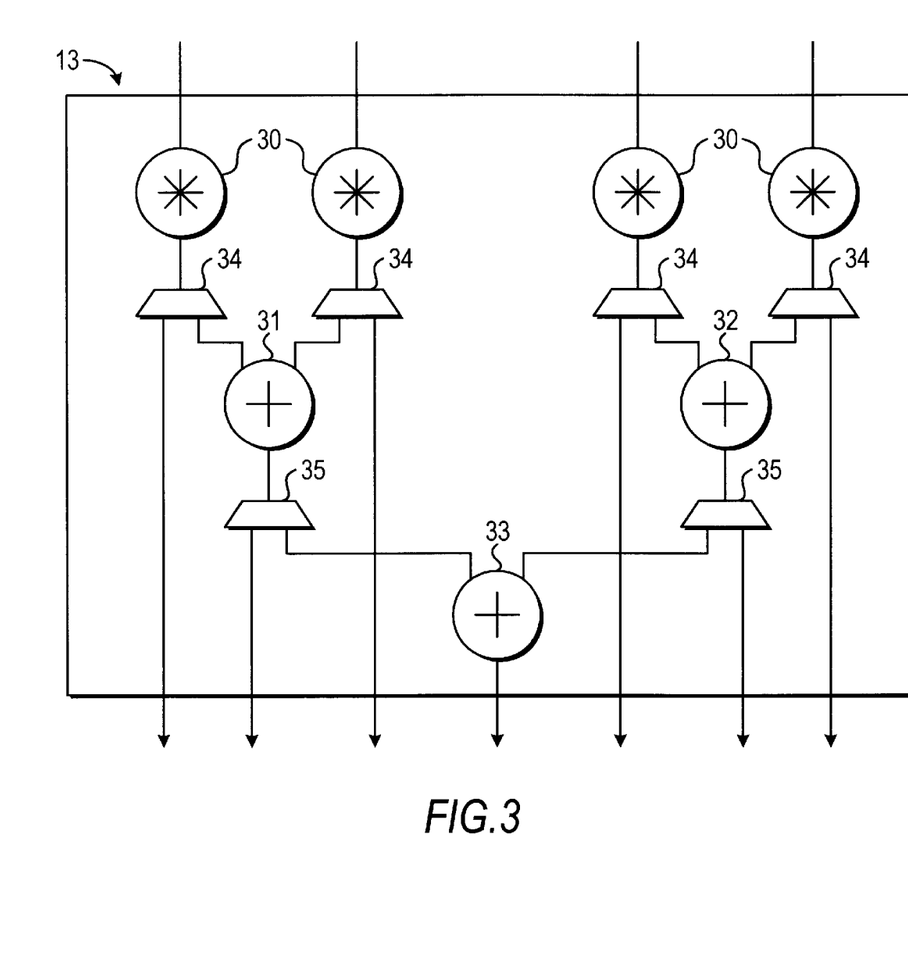
FIG. 3 is a more detailed schematic diagram of the multiplier/accumulator block shown in FIG. 2.

As seen in FIG. 3, which shows more detail of MAC block 13, it is possible using multiplexers 34 to select the output of one of multipliers 30 as the output of block 13, in which case all of adders 31, 32, 33 would remain unused, but would still receive inputs and consume power. Alternatively, it is possible using multiplexers 35 to select the output or outputs of one or both of adders 31, 32 as the output of MAC block 13, in which case adder 33 would remain unused, but would still receive inputs and consume power. Either way, one or more of adders 31–33 would be consuming power.

Figure 4:
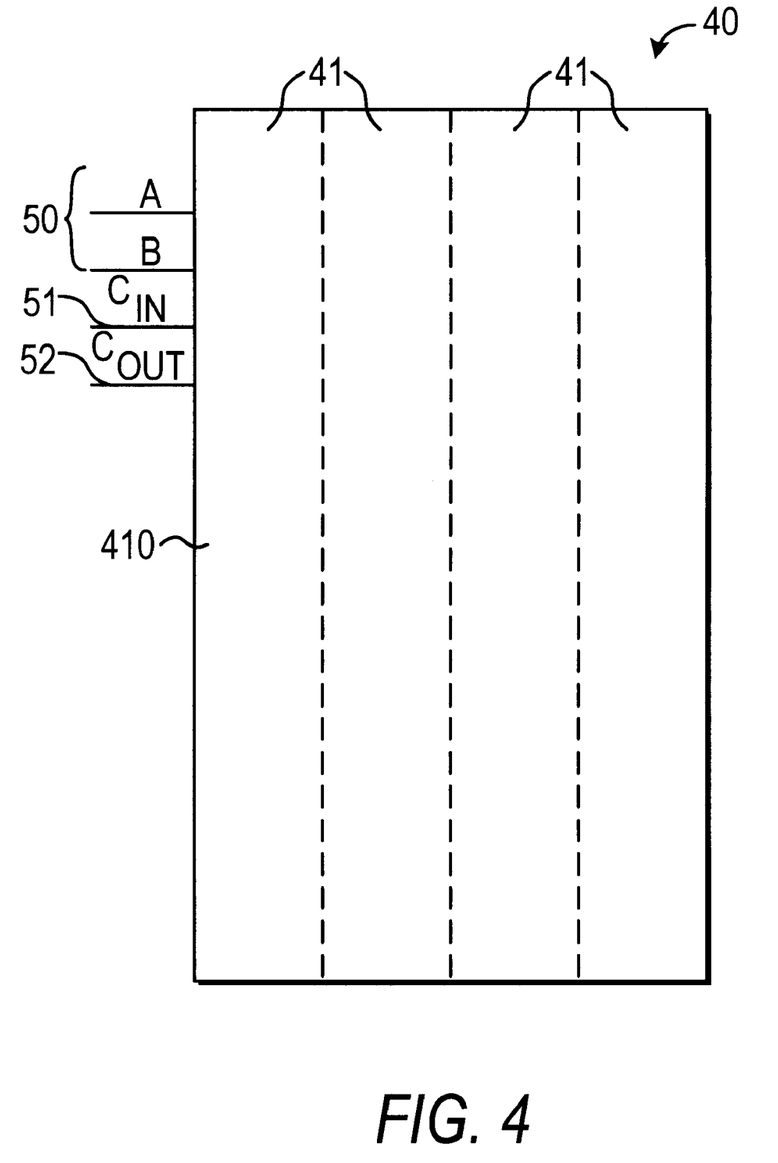
FIG. 4 is a schematic diagram of an adder block in the multiplier/accumulator block of FIGS. 2 and 3.

In the preferred embodiments shown, MAC block 13 accepts multiple-bit inputs. Accordingly, as shown in FIG. 4, a representative one 40 of adders 31–33 actually includes a plurality of adder stages 41. In such an arrangement, if the first one 410 of adder stages 41 could be disconnected or turned off, the subsequent adder stages 41 would not receive input signals, and therefore would not switch or consume significant power.

Figure 5:
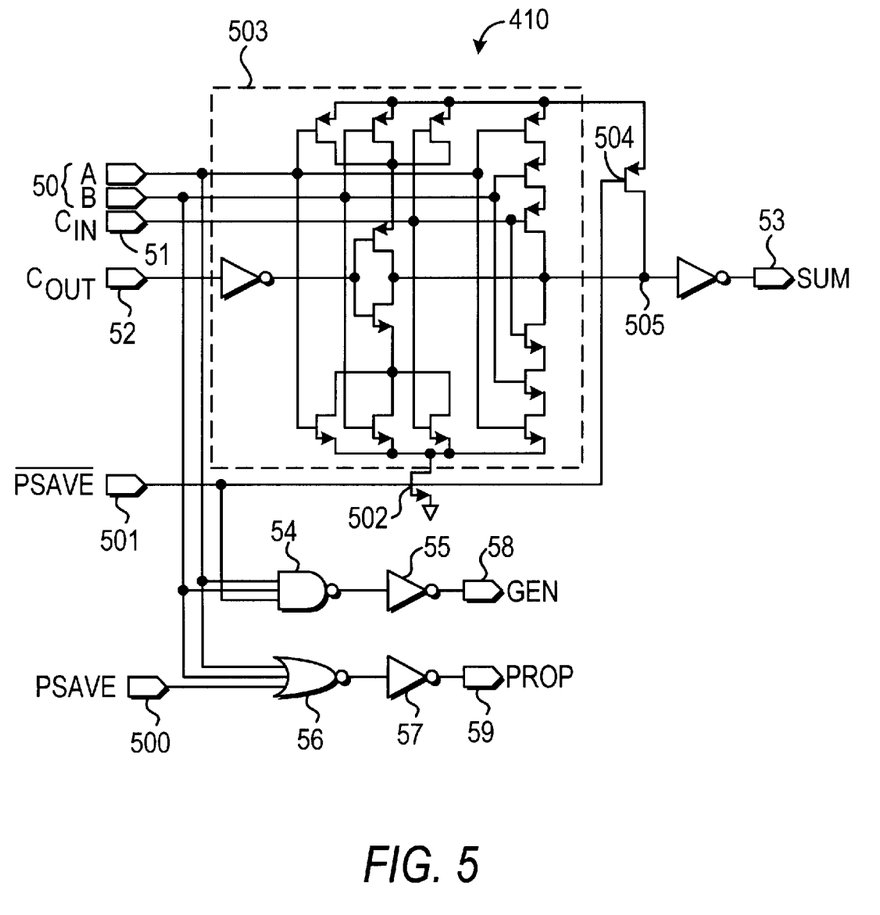
FIG. 5 is a schematic diagram of a preferred embodiment of an adder stage in accordance with the present invention in the adder block of FIG. 4.

A preferred embodiment of adder stage 410 is shown in more detail in FIG. 5. Adder stage 410 accepts two data inputs A, B on input terminals 50, as well as carry signals $C_{IN}$ and $C_{OUT}$ (generated in another stage) on carry terminals 51, 52, and generates an output SUM signal 53. Because adder stage 410 preferably is a carry/look-ahead adder, it preferably also operates on data signals A, B, using NAND gate 54 and inverter 55, and NOR gate 56 and inverter 57, to respectively provide a GEN (i.e., "generate") signal 58 and a PROP (i.e., "propagate"). signal 59 as carry/look-ahead signals that are used to derive the signals $C_{IN}$ and $C_{OUT}$ for use by a subsequent adder stage 41.

In accordance with the present invention, adder stage 410 has two additional inputs PSAVE and $\overline{PSAVE}$ on terminals 500, 501 respectively, which are used to put adder stage 410 in low-power mode. PSAVE and $\overline{PSAVE}$ could be provided as a single signal, appropriately inverted where necessary. As seen in FIG. 5, when PSAVE is asserted high and $\overline{PSAVE}$ is asserted low to enter low-power mode, NMOS transistor 502 is turned off, disconnecting the current path through functional components 503, effectively turning them off and preventing them from switching. At the same time, PMOS transistor 504 is turned on, pulling node 505 high, forcing output SUM signal 53 low, so that no signal is input as data to subsequent stages 41.

In a previously known carry/look-ahead circuit, NAND gate 54 and NOR gate 56 would have two inputs each. However, in preferred adder stage 410, each has three inputs. When PSAVE is asserted high, the input of PSAVE to NOR gate 56 forces the output of NOR gate 56 low, so that PROPAGATE signal 59 is a constant high that does not switch. Similarly, when $\overline{PSAVE}$ is asserted low, the input of $\overline{PSAVE}$ to NAND gate 54 forces the output of NAND gate 54 high, so that GENERATE signal 58 is a constant low that does not switch. Thus, the GENERATE and PROPAGATE look-ahead signals do not switch, and do not cause subsequent stages 41 to switch.

Figure 6:
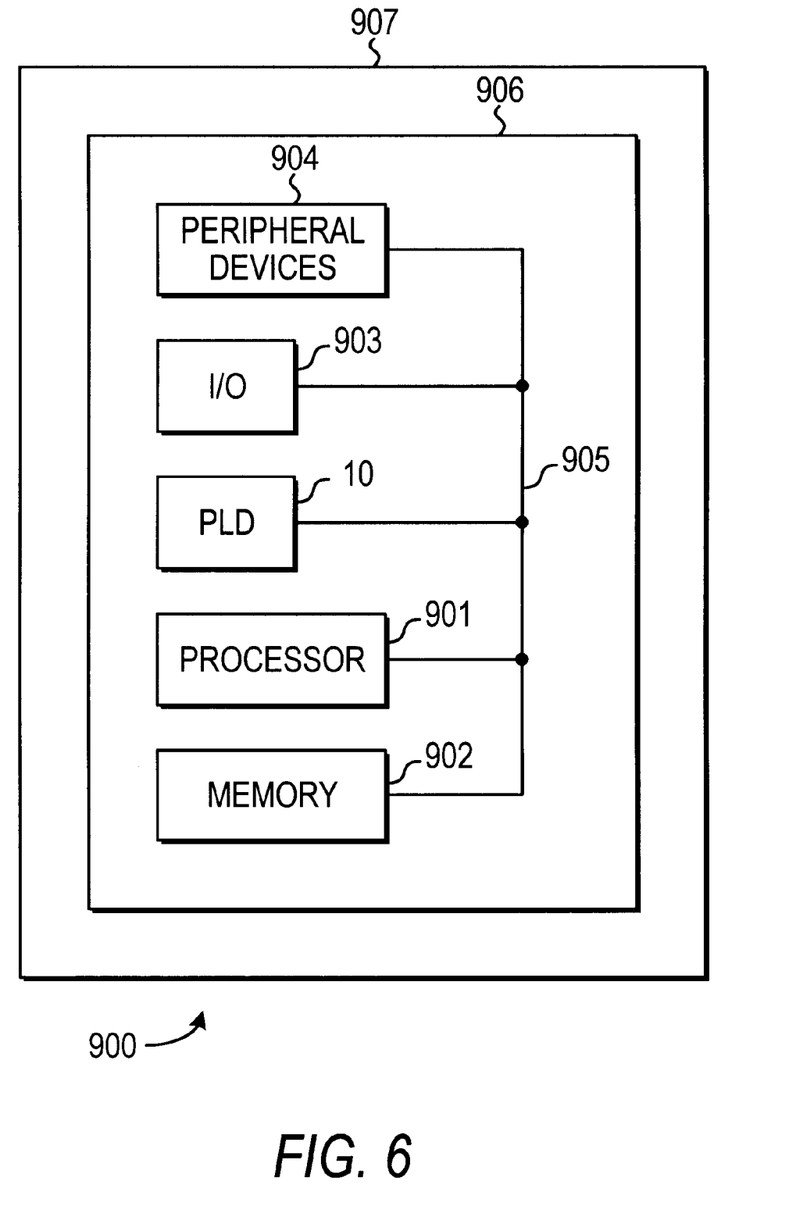
FIG. 6 is a simplified block diagram of an illustrative system employing a programmable logic device incorporating a specialized functional region in accordance with the invention.

Programmable logic device 10 incorporating low-power adder circuit 40 may be used as part of a data processing system 900 shown in FIG. 6. The state of low-power signals PSAVE and $\overline{PSAVE}$ may be controlled by the setting of a configuration bit in device 10. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 901. Programmable logic device 10 may also be used as an arbiter for arbitrating access to a shared resource in system 900. In yet another example, programmable logic device 10 can be configured as an interface between processor 901 and one of the other components in system 900. It should be noted that system 900 is only exemplary, and that the true scope and spirit of the invention should be indicated by the following claims.

Various technologies can be used to implement programmable logic devices 10 employing low-power adders 40 as described above according to this invention. Moreover, this invention is applicable to both one-time-only programmable and reprogrammable devices.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A specialized functional region for a programmable logic device, said specialized functional region comprising:
   functional circuitry that performs at least one specialized function, said functional circuitry comprises an arithmetic circuit including:
      at least one functional circuit input, and
      at least one functional circuit element that consumes power when said functional circuit input changes state; and
      at least one control element having a control input and being responsive to a low-power mode selection signal on said control input for at least reducing consumption of power by said functional circuit element when said functional circuit input changes state.

2. The specialized functional region of claim 1 wherein said arithmetic circuit is an adder circuit.

3. The specialized functional region of claim 2 wherein said adder circuit is a carry/look-ahead adder, wherein:
   a first one of said at least one functional circuit element generates a sum signal; and
   at least a second one of said at least one functional circuit element is a logic gate that generates a look-ahead signal.

4. The specialized functional region of claim 3 wherein:
   said at least one control element comprises a transistor; and
   when said low-power mode selection signal is asserted to select a low-power mode, said transistor disconnects said first one of said at least one functional circuit element from one of (a) a power supply, and (b) ground.

5. The specialized functional region of claim 4 wherein:
   said logic gate further functions as one of said at least one control element; and when said low-power mode selection signal is asserted to select a low-power mode, said logic gate generates an output having a fixed state.

6. The specialized functional region of claim 5 wherein:
said logic gate is a NAND gate;
said low-power mode selection signal is a first input to said NAND gate;
said NAND gate has at least one functional input; and
when said low-power mode selection signal is low, said look-ahead signal is high regardless of said at least one functional input.

7. The specialized functional region of claim 5 wherein:
said logic gate is a NOR gate;
said low-power mode selection signal is a first input to said NOR gate;
said NOR gate has at least one functional input; and
when said low-power mode selection signal is high, said look-ahead signal is low regardless of said at least one functional input.

8. The specialized functional region of claim 3 wherein:
said logic gate further functions as one of said at least one control element; and
when said low-power mode selection signal is asserted to select a low-power mode, said logic gate generates an output having a fixed state.

9. The specialized functional region of claim 8 wherein:
said logic gate is a NAND gate;
said low-power mode selection signal is a first input to said NAND gate;
said NAND gate has at least one functional input; and
when said low-power mode selection signal is low, said look-ahead signal is high regardless of said at least one functional input.

10. The specialized functional region of claim 8 wherein:
said logic gate is a NOR gate;
said low-power mode selection signal is a first input to said NOR gate;
said NOR gate has at least one functional input; and
when said low-power mode selection signal is high, said look-ahead signal is low regardless of said at least one functional input.

11. The specialized functional region of claim 3 wherein:
said carry/look-ahead adder is an initial stage of a larger arithmetic circuit; and
when said low-power mode selection signal is asserted to select a low-power mode, said sum and look-ahead signals are fixed, preventing switching of other portions of a said larger arithmetic circuit.

12. The specialized functional region of claim 11 wherein:
said at least one control element comprises a transistor; and
when said low-power mode selection signal is asserted to select a low-power mode, said transistor disconnects said first one of said at least one functional circuit element from one of (a) a power supply, and (b) ground.

13. The specialized functional region of claim 11 wherein:
said logic gate further functions as one of said at least one control element; and
when said low-power mode selection signal is asserted to select a low-power mode, said logic gate generates an output having a fixed state.

14. The specialized functional region of claim 13 wherein:
said logic gate is a NAND gate;
said low-power mode selection signal is a first input to said NAND gate;
said NAND gate has at least one functional input; and
when said low-power mode selection signal is low, said look-ahead signal is high regardless of said at least one functional input.

15. The specialized functional region of claim 13 wherein:
said logic gate is a NOR gate;
said low-power mode selection signal is a first input to said NOR gate;
said NOR gate has at least one functional input; and
when said low-power mode selection signal is high, said look-ahead signal is low regardless of said at least one functional input.

16. The specialized functional region of claim 11 wherein:
said logic gate further functions as one of said at least one control element; and
when said low-power mode selection signal is asserted to select a low-power mode, said logic gate generates an output having a fixed state.

17. The specialized functional region of claim 16 wherein:
said logic gate is a NAND gate;
said low-power mode selection signal is a first input to said NAND gate;
said NAND gate has at least one functional input; and
when said low-power mode selection signal is low, said look-ahead signal is high regardless of said at least one functional input.

18. The specialized functional region of claim 16 wherein:
said logic gate is a NOR gate;
said low-power mode selection signal is a first input to said NOR gate;
said NOR gate has at least one functional input; and
when said low-power mode selection signal is high, said look-ahead signal is low regardless of said at least one functional input.

19. A programmable logic device comprising:
programmable logic circuitry generating a logical output; and
the specialized functional region of claim 11; wherein:
said logical output is connected to said at least one functional circuit input.

20. The programmable logic device of claim 19 further comprising:
additional programmable logic circuitry having at least one logical input; wherein:
at least one of said sum signal and at least one look-ahead signal is connected to said at least one logical input.

21. A digital processing system comprising:
processing circuitry;
a memory coupled to said processing circuitry; and
a programmable logic device as defined in claim 19 coupled to the processing circuitry and the memory.

22. A printed circuit board on which is mounted a programmable logic device as defined in claim 19.

23. The printed circuit board defined in claim 22 further comprising:
memory circuitry mounted on the printed circuit board and coupled to the programmable logic device.

24. The printed circuit board defined in claim 23 further comprising:
processing circuitry mounted on the printed circuit board and coupled to the memory circuitry.

25. A programmable logic device comprising:
  programmable logic circuitry having at least one logical input; and
  the specialized functional region of claim 11; wherein:
    at least one of said sum signal and at least one look-ahead signal is connected to said at least one logical input.

26. A digital processing system comprising:
  processing circuitry;
  a memory coupled to said processing circuitry; and
  a programmable logic device as defined in claim 25 coupled to the processing circuitry and the memory.

27. A printed circuit board on which is mounted a programmable logic device as defined in claim 25.

28. The printed circuit board defined in claim 27 further comprising:
  memory circuitry mounted on the printed circuit board and coupled to the programmable logic device.

29. The printed circuit board defined in claim 28 further comprising:
  processing circuitry mounted on the printed circuit board and coupled to the memory circuitry.

30. A programmable logic device comprising:
  programmable logic circuitry generating a logical output; and
  the specialized functional region of claim 1; wherein:
    said logical output is connected to said at least one functional circuit input.

31. The programmable logic device of claim 30 further comprising:
  additional programmable logic circuitry having at least one logical input; wherein:
  said functional circuitry has at least one functional circuit output; and
  at least one of said at least one functional circuit output is connected to said at least one logical input.

32. A digital processing system comprising:
  processing circuitry;
  a memory coupled to said processing circuitry; and
  a programmable logic device as defined in claim 30 coupled to the processing circuitry and the memory.

33. A printed circuit board on which is mounted a programmable logic device as defined in claim 30.

34. The printed circuit board defined in claim 33 further comprising:
  memory circuitry mounted on the printed circuit board and coupled to the programmable logic device.

35. The printed circuit board defined in claim 34 further comprising:
  processing circuitry mounted on the printed circuit board and coupled to the memory circuitry.

36. A programmable logic device comprising:
  programmable logic circuitry having a logical input; and
  the specialized functional region of claim 1; wherein:
    said functional circuitry has at least one functional circuit output; and
    one of said at least one functional circuit output is connected to said logical input.

37. A digital processing system comprising:
  processing circuitry;
  a memory coupled to said processing circuitry; and
  a programmable logic device as defined in claim 36 coupled to the processing circuitry and the memory.

38. A printed circuit board on which is mounted a programmable logic device as defined in claim 36.

39. The printed circuit board defined in claim 38 further comprising:
  memory circuitry mounted on the printed circuit board and coupled to the programmable logic device.

40. The printed circuit board defined in claim 39 further comprising:
  processing circuitry mounted on the printed circuit board and coupled to the memory circuitry.

* * * * *